US010594327B2

(12) United States Patent
Vaucher et al.

(10) Patent No.: US 10,594,327 B2
(45) Date of Patent: Mar. 17, 2020

(54) APPARATUS COMPRISING A PHASE-LOCKED LOOP

(71) Applicant: NXP B.V., Eindhoven (NL)

(72) Inventors: Cicero Silveira Vaucher, Eindhoven (NL); Sander Derksen, Hank (NL); Erwin Janssen, Veldhoven (NL); Bernardus Johannes Martinus Kup, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/118,974

(22) Filed: Aug. 31, 2018

(65) Prior Publication Data
US 2019/0131981 A1    May 2, 2019

(30) Foreign Application Priority Data
Oct. 31, 2017   (EP) .................................... 17199331

(51) Int. Cl.
*H03L 7/06*   (2006.01)
*H03L 7/099*  (2006.01)
(Continued)

(52) U.S. Cl.
CPC ........... *H03L 7/0992* (2013.01); *H03L 7/091* (2013.01); *H03L 7/18* (2013.01); *H03L 7/185* (2013.01); *H03L 7/191* (2013.01)

(58) Field of Classification Search
None
See application file for complete search history.

(56) References Cited

U.S. PATENT DOCUMENTS

| | | | |
|---|---|---|---|
| 6,295,328 B1 * | 9/2001 | Kim ..................... | H03K 5/1565 375/376 |
| 6,774,689 B1 * | 8/2004 | Sudjian ................ | H03L 7/0812 327/158 |
| 6,798,303 B2 * | 9/2004 | Steinecke ............. | H03K 5/159 327/153 |

(Continued)

FOREIGN PATENT DOCUMENTS

| EP | 0828343 A1 * | 3/1998 | ............. H03B 29/00 |
|---|---|---|---|
| WO | WO-2007067631 A2 * | 6/2007 | ....... G01R 31/31726 |

OTHER PUBLICATIONS

CETECOM ICT Services, Test report No. 1-7342/14-01-02_AnnexB, Jul. 7, 2014.

(Continued)

*Primary Examiner* — Lincoln D Donovan
*Assistant Examiner* — Khareem E Almo

(57) ABSTRACT

There is disclosed an apparatus comprising a first phase-locked loop comprising: a phase detector (302, 304), arranged to receive a reference clock signal (306) and a feedback clock signal (308) and to output a frequency control signal based on a phase difference between the reference clock signal (306) and the feedback clock signal (308); a variable-frequency oscillator (312, 314) arranged to output an oscillator signal having a frequency dependent on said frequency control signal; first divider circuitry (316) for generating said feedback clock signal (308) by frequency-dividing said oscillator signal; and second divider circuitry (320) for generating an output clock signal (3220 by frequency-dividing said oscillator signal; wherein a phase relation between said first divider circuitry (316) and said second divider circuitry (320) is adjustable to delay or advance said output clock signal (322) relative to said feedback clock signal (308). The apparatus may be a radar receiver or transceiver.

20 Claims, 6 Drawing Sheets

(51) Int. Cl.
*H03L 7/091* (2006.01)
*H03L 7/191* (2006.01)
*H03L 7/185* (2006.01)
*H03L 7/18* (2006.01)

(56) References Cited

U.S. PATENT DOCUMENTS

| | | | | |
|---|---|---|---|---|
| 7,061,288 B2* | 6/2006 | Burgess | ............... | H03L 7/0891 |
| | | | | 327/156 |
| 7,158,603 B2* | 1/2007 | Sofianos | ............. | H03C 3/0925 |
| | | | | 327/156 |
| 2003/0189464 A1 | 10/2003 | Drapkin et al. | | |
| 2006/0132202 A1* | 6/2006 | Meltzer | .................. | H03L 7/099 |
| | | | | 327/156 |
| 2008/0106339 A1* | 5/2008 | Adlerstein | ............ | H01Q 3/30 |
| | | | | 331/2 |
| 2008/0129388 A1* | 6/2008 | Gonzalez | ............. | H03L 7/0893 |
| | | | | 331/10 |
| 2008/0315960 A1* | 12/2008 | Waheed | ................ | G04F 10/005 |
| | | | | 331/17 |
| 2015/0222275 A1* | 8/2015 | Reichelt | ................ | H03L 7/0802 |
| | | | | 327/142 |
| 2015/0222278 A1* | 8/2015 | Reichelt | .................... | H03L 7/18 |
| | | | | 327/156 |
| 2016/0065227 A1* | 3/2016 | Ainspan | .................. | H03B 1/00 |
| | | | | 331/8 |
| 2017/0366190 A1* | 12/2017 | Leong | .................. | H03L 7/0807 |
| 2018/0048323 A1* | 2/2018 | Yamauchi | ............ | H03L 7/1974 |

OTHER PUBLICATIONS

Maurer, L., "77 GHz SiGe Based Bipolar Tranceivers for Automotive Radar Applications—An Industrial Perspective", IEEE 2011.

* cited by examiner

APPARATUS COMPRISING A PHASE-LOCKED LOOP

CROSS-REFERENCE TO RELATED APPLICATIONS

This application claims the priority under 35 U.S.C. § 119 of European Patent application no. 17199331.4, filed on 31 Oct. 2017, the contents of which are incorporated by reference herein.

FIELD OF THE INVENTION

The present invention relates to an apparatus comprising a phase-locked loop. In particular, but not exclusively, it relates to a radar receiver or transceiver.

BACKGROUND OF THE INVENTION

High performance automotive radar sensors for autonomous driving need to comply with stringent angular resolution requirements. Angular resolution relates directly to the system total antenna aperture, which in turn normally relates to the number of receive antennas and their localization with respect to each other.

To avoid so-called grating lobes in the angular response (i.e. false target detection at certain angular positions), it is necessary that the antennas be located not further than $\lambda/2$ from each other, with $\lambda$ being the wavelength of carrier signal. In practice, aperture sizes in the range of $6\lambda$ to $10\lambda$ are common, which combined with the $\lambda/2$ criteria for each antenna leads to a number of antenna receiver elements between 12 and 20.

FIG. 1 shows an image of an example radar sensor comprising 12 RX antennas attached to three separate RX chips. A TX chip can be seen on the left part of the image, while the three RX chips can be seen in the central part of the image. Each of the 12 RX antenna elements connects to a separate receiver channel, with the receiver channels being distributed across the three RX chips.

For a complete system realization, each RX antenna signal must be down-converted to baseband and then transferred to the digital domain using a respective analog-to-digital converter (ADC). Both the local oscillator signal used to down-convert the RX antenna signals and the sampling clock signal of the different ADCs must be phase-coherent and stable with respect to the corresponding signals of the other ADCs. Otherwise, errors in the angular position estimates are introduced during signal processing in the base-band, and the advantages of using a large array to increase sensor angular resolution may be lost.

Several integrated circuit chip-sets are available, offering down-conversion operation and flexibility for creating different sizes of antenna arrays. In addition to the example shown in FIG. 1, further example configurations of RX and TX channels supported by combinations of available chips are presented in FIG. 2. However these circuits do not offer integrated ADCs and as such do not deal with the requirement for ADC clock synchronization discussed above.

SUMMARY OF THE INVENTION

Aspects of the invention are set out in the accompanying claims. Combinations of features from the dependent claims may be combined with features of the independent claims as appropriate and not merely as explicitly set out in the claims.

According to an aspect of the invention, there is provided an apparatus comprising:

a first phase-locked loop comprising:

a phase detector, arranged to receive a reference clock signal and a feedback clock signal and to output a frequency control signal based on a phase difference between the reference clock signal and the feedback clock signal;

a variable-frequency oscillator arranged to output an oscillator signal having a frequency dependent on said frequency control signal;

first divider circuitry for generating said feedback clock signal by frequency-dividing said oscillator signal; and second divider circuitry for generating an output clock signal by frequency-dividing said oscillator signal;

wherein a phase relation between said first divider circuitry and said second divider circuitry is adjustable to delay or advance said output clock signal relative to said feedback clock signal.

By enabling the output clock signal to be delayed or advanced relative to the feedback clock signal, the present invention enables compensation of timing differences due to delays in transmission of a reference clock signal between different elements of the apparatus, thereby improving clock synchronisation. In particular, the present invention enables compensation of timing delays due to PCB skew.

In some embodiments, the apparatus further comprises an inverter for inverting said oscillator signal to generate an inverted oscillator signal, wherein:

one of said first divider circuitry and said second divider circuitry comprises a first master divider arranged to receive said oscillator signal;

the other one of said first divider circuitry and said second divider circuitry comprises a first slave divider arranged to selectively receive said oscillator signal or said inverted oscillator signal; and said first slave divider is configured to re-clock a selected output of said first master divider based on said selected one of said oscillator signal and said inverted oscillator signal.

This enables one of the feedback clock signal or the output clock signal to be delayed by a step of half a period of the oscillator signal.

The output clock signal may be delayed or advanced relative to said feedback clock signal by a multiple of one half of a period of said oscillator signal.

Said first master divider and said first slave divider may each be configured to divide by 2.

In some embodiments, said first slave divider is configured to re-clock a selected one of four-phase outputs of said first master divider.

In some embodiments, said first slave divider comprises the same circuitry as said first master divider.

This may help to ensure equal delays at the master and slave dividers.

In some embodiments, said first master divider comprises a differential or semi-differential flip-flop.

This may enable outputs of opposite phase to be available without incurring a relative delay.

In some embodiments:

said one of said first divider circuitry and said second divider circuitry comprises a second master divider arranged to receive an output of said first master divider;

said other one of said first divider circuitry and said second divider circuitry comprises a second slave divider arranged to receive an output of said first slave divider, and said second slave divider is configured to re-clock a selected output of said second master divider based on said output of said first slave divider.

In some embodiments:

said one of said first divider circuitry and said second divider circuitry comprises a third master divider arranged to receive an output of said second master divider;

said other one of said first divider circuitry and said second divider circuitry comprises a third slave divider arranged to receive an output of said second slave divider; and said third slave divider is configured to re-clock a selected output of said third master divider based on said output of said second slave divider.

Said second master divider and said second slave divider may be each configured to divide by two.

Said third master divider and said third slave divider may be each configured to divide by two.

The output clock signal may have a frequency equal to one eighth of the frequency of the oscillator signal.

Said second divider circuitry may comprise at least one further divider.

The apparatus may further comprise circuitry for re-clocking said feedback clock signal based on said output clock signal.

This may enable adjustment of the output clock frequency relative to the feedback clock frequency by more than one period of the output clock frequency.

The reference clock signal may be received via a printed circuit board.

In some embodiments, the apparatus comprises:
a first integrated chip comprising:
said first phase-locked loop, and
a first ADC arranged to receive said output clock signal.
In some embodiments, said apparatus comprises:
a second integrated chip, comprising:
a second phase-locked loop configured to output a further output clock signal; and
a further ADC arranged to receive said further output clock signal;
wherein said first integrated chip is arranged to receive said reference dock signal from said second integrated chip.

The first phase-locked loop may comprise circuitry for buffering said reference clock signal.

The apparatus may be a radar receiver or transceiver.

In a radar receiver or transceiver, circuitry required for signal generation, transmission and/or reception may also be included in the first and/or second integrated chip.

The apparatus may be a phased-array radar receiver or transceiver.

BRIEF DESCRIPTION OF THE DRAWINGS

Embodiments of the present invention will be described, by way of example only, with reference to the accompanying drawings in which like reference signs relate to like elements and in which.

DETAILED DESCRIPTION

Figure 1:
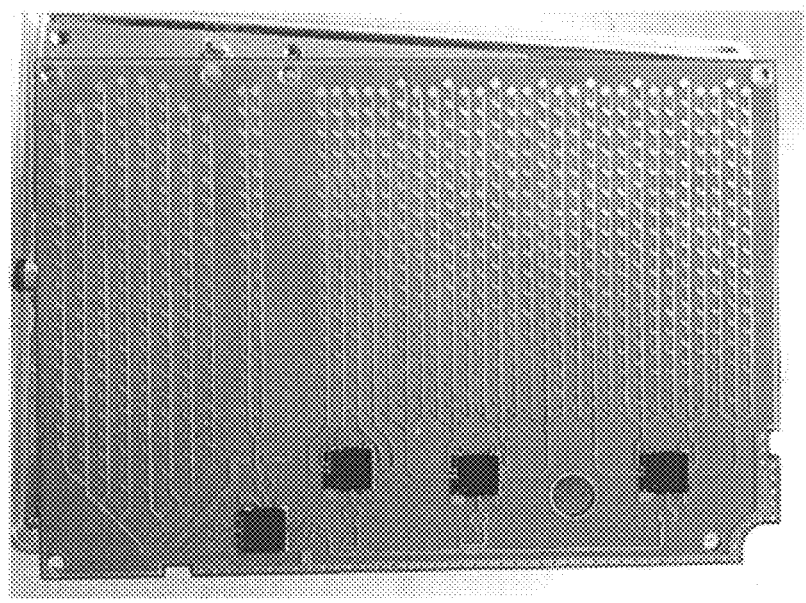
FIG. 1 shows an image of an example radar sensor comprising 12 RX antennas attached to three separate RX chips.
Figure 2:
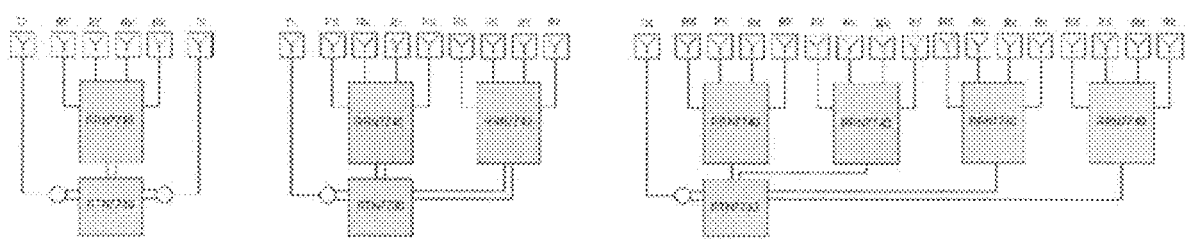
FIG. 2 shows example configurations of RX and TX channels supported by combinations of available chips.
Figure 3:
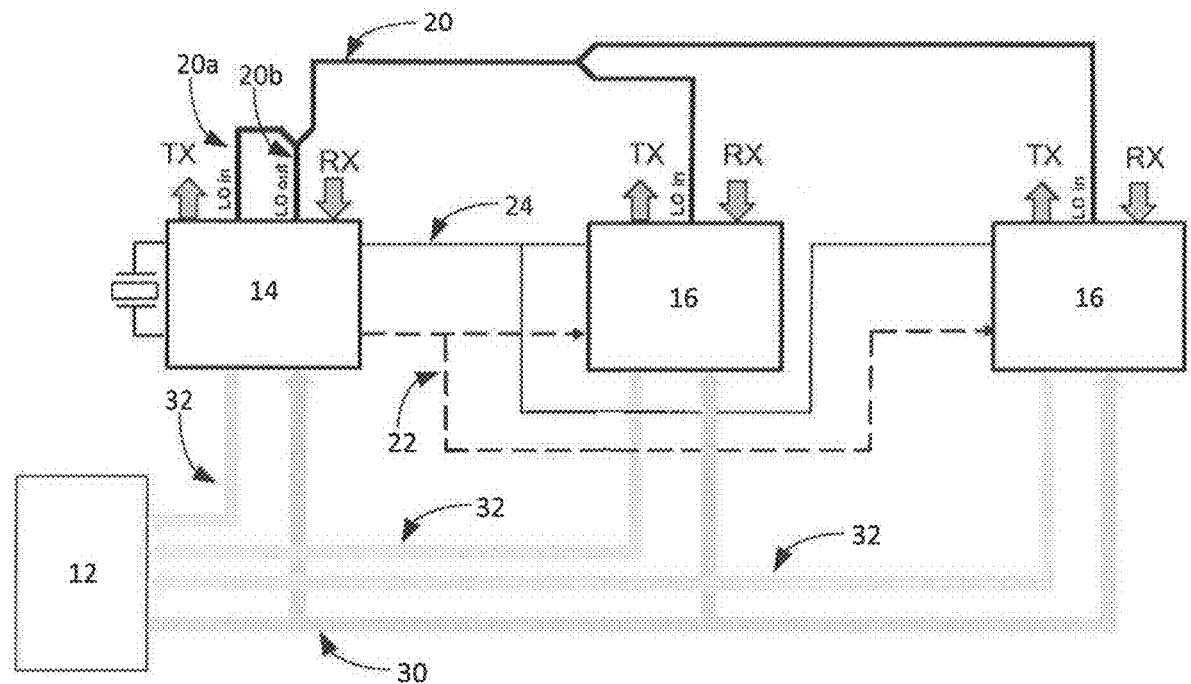
FIG. 3 shows a configuration of a multiple-chip radar sensor system 10 according to an example embodiment of the present invention.

FIG. 3 shows a configuration of a multiple-chip radar sensor system 10 according to an embodiment of the present invention. The system 10 comprises a main computing unit (MCU) 12, a "master" integrated chip (IC) 14 and a number of "slave" ICs 16 (of which two are shown in FIG. 3).

The "master" IC 14 provides a number of signals to the "slave" ICs 16, including: a local oscillator signal (LO) 20, used for the transmit (TX) amplifiers and receiver (RX) mixers (not shown in FIG. 3); a "chirp start" signal 22, used to trigger the starting point of the timing engines (not shown in FIG. 3) within each IC 14, 16; and a 40 MHz reference clock signal 24, used as a time base for synchronization of the sampling moments on the ADCs on the master and slave ICs. In the arrangement shown in FIG. 3, the master IC 14 has a local oscillator (LO) input port ("LO in", 20*a*) in addition to the local oscillator output port ("LO out", 20*b*). The use of separate LO input and output ports 20*a*, 20*b* is known in the art and is optional in the present invention.

The MCU 12 is connected to the master and slave ICs (14, 16) by SPI (serial peripheral interface) control lines (30) and digital lines (32), for example using CSI-2, LVDS or CIF formats, for receiving data from the ICs (14, 16).

In a typical configuration, each IC contains three operational transmit (TX) ports and four receiver (RX) ports. Thus the arrangement shown in FIG. 3 comprising a master IC and two slave ICs would typically offer 9 transmit (TX) ports and 12 receiver (RX) ports in total, although FIG. 3 shows only one TX and one RX port is shown for each IC.

Figure 4:
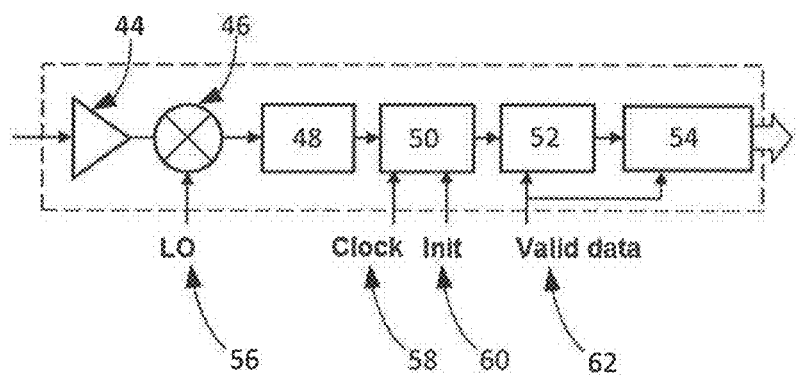
FIG. 4 is a block diagram illustrating one of the receiver (RX) channels of the radar system shown in FIG. 3.

FIG. 4 is a block diagram illustrating one of the receiver (RX) channels of the radar system shown in FIG. 3. Each RX channel includes the same functional blocks: amplifier 44, mixer 46, intermediate frequency (IF) filter 48, ADC 50, decimation stage 52 and serial interface 54, as is known in the art. The main control and timing signals are:
a local oscillator (LO) signal 56 input to the mixer 46,
an 'ADC Clock' signal 58, for determining the sampling moments of the ADC, and an 'Init' signal 60 for the ADC 50, and a 'Valid data' signal 62 for the decimation stage 52 and serial interface 54, providing timing information indicating at which moment the ADC data is to be considered as valid radar data.

For optimal operation of the distributed radar system, it is important that these control and timing signals 56, 58, 60, 62 are synchronous across all receiver (RX) channels on different ICs 14, 16. 'Synchronous' means that the phase and/or active edges of the signals are aligned with each other, with the internal ports of each RX channel taken as the reference point.

For the next generation of highly-integrated radar sensors, in which signal generation, transmission, reception and digitization are integrated in a single monolithic die, a method to synchronize and stabilize the phase of the ADC clock 58 across different ICs 14, 16 is needed.

Printed circuit board (PCB) skews on synchronization signals transmitted between different chips 14, 16 potentially decrease the accuracy ("synchronicity") of the local timing signals on different chips, thereby introducing errors in the data sent by the respective ADC 50 to the baseband processor (MCU) 12. More specifically, a shift in the sampling time moment of the ADC 50 translates into an equivalent error in the phase of the sampled signal output by the ADC 50. The error is proportional to the frequency of signal being sampled, leading to a frequency-dependent phase error component. This is undesirable, for several reasons.

In a phased array receiver, the relative phase of the signals received across several receivers indicates the angular position of a reflecting object with respect to the radar sensor. Therefore, if the accuracy of the received signal phases is compromised due to sampling moment deviations, due for example to a skew on the connecting line between two chips in the phased array receiver, an error is introduced in the estimation of the angular position of the reflecting object with respect to the radar sensor. This is obviously undesirable, as it decreases the angular detection performance of the radar sensor.

In applications in which two or more radar ICs 14, 16 must work together, the phases of the respective ADC clock signals 58 of each IC 14, 16 must be aligned within a tight tolerance. In this case, one of the ICs works as master IC 14, the other(s) as slave IC(s) 16.

Figure 5:
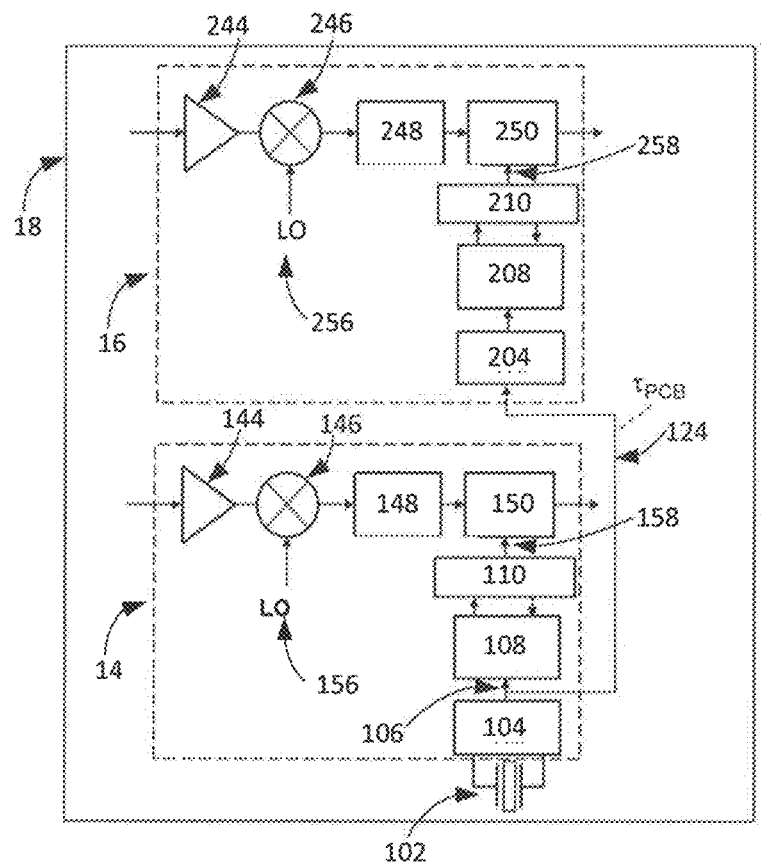
FIG. 5 illustrates two radar integrated chips (ICs) operating as master IC and slave IC in a multiple IC radar receiver system, according to an example embodiment of the present invention.

FIG. 5 illustrates two radar ICs 14, 16 operating as master IC 14 and slave IC 16 in a multiple IC receiver system. Although only one slave IC 16 is shown, the system may comprise multiple slave ICs 16.

The master IC 14 illustrated in FIG. 5 includes an amplifier 144, a mixer 146 arranged to receive a LO signal 156, an intermediate frequency (IF) filter 148, and an ADC 150 arranged to receive an ADC clock signal 158, as discussed above. The master IC 14 uses a crystal resonator 102 and associated oscillator circuitry 104 to create the overall system time-base, which is then shared with the slave IC 14. In a typical application, the crystal oscillator 102, 104 generates a 40 MHz reference clock signal 106. A phase locked loop (PLL) 108, 110 is referenced to the crystal oscillator 102, 104, and is used to derive the ADC clock signal 158 for the ADC 150 on the Master IC 14.

The slave IC 16 illustrated in FIG. 5 also includes an amplifier 244, a mixer 246 arranged to receive an LO signal 256, an intermediate frequency (IF) filter 248, and an ADC 250 arranged to receive an ADC clock signal 258 as discussed above. The reference clock signal 106 generated by the crystal oscillator 102, 104 on the Master IC 14 is transferred to the slave IC 16 via a PCB connection 124 of a printed circuit board (PCB) 18. The slave IC 16 includes oscillator circuitry 204, which is identical to the oscillator circuitry 104 of the master IC 16 connected to the crystal resonator 102, which operates as an input buffer for the reference clock signal 106 received at the slave IC 16 from the master IC 14. The slave IC 16 also includes a PLL clock generator 208, 210, for generating the Clock ADC signal 258 used by the ADC 250 on the slave IC 16.

However, the PCB connection 124 between the master and slave ICs 14, 16 and the output and input buffers (not shown) leads to a time skew (i.e. time difference) $\tau_{PCB}$, known as "PCB skew", between the active edge of the respective sampling signals "Clock ADC" 158, 258 input to the respective ADCs 150, 250 of the master and slave ICs 14, 16. This causes the sampling moment of the ADC 250 of the slave IC 16 to be delayed with respect to the sampling moment of the ADC 150 of the master IC 14, typically by a few nanoseconds. As discussed above, this timing difference leads to an error on the relative phase of the digitized signal produced by the master and slave ADCs 150, 250.

To illustrate the effect of the PCB skew $\tau_{PCB}$, the specified phase stability between RX channels usually requires the phase deviation to be contained within +/−2 degrees. For an intermediate frequency (IF) frequency of up to 10 MHz, a realistic yet small PCB skew of ~1 ns leads to a 3.6 degree phase estimation error at the highest IF frequency, due to the shift in sampling moment. For the next generation of radar sensors with IF frequencies of up to 20 MHz, the same ins PCB skew will result in a 7.2 degree error in the phase estimation, which is much above the overall phase stability specification mentioned above. Therefore, it is necessary that systems with distributed ADCs incorporate means for correcting PCB skews.

To compensate for the time delay introduced by PCB skew $\tau_{PCB}$, the PLL clock generators 108, 110, 208, 210 illustrated in FIG. 5 include circuitry 110, 210 for introducing digitally-controlled time shifts in the ADC clock signals 158, 258 input to the respective ADCs 150, 250 of the master and slave ICs 14, 16. This is referred to as 'fine pitch output clock skew'. In this way, it is possible to achieve synchronization of the 'Clock' signals 158, 258 and 'Init' signals 160, 260 on the ADCs of the different RX channels of the distributed radar system.

Figure 6A:
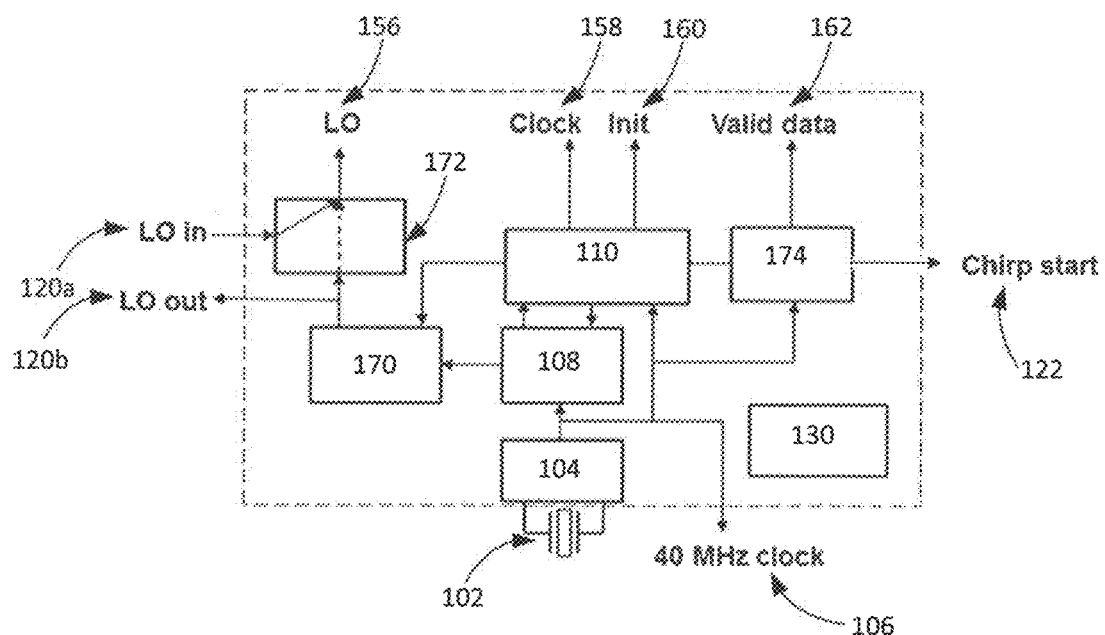
FIGS. 6A and 6B illustrate the internal architecture of the clock circuitry for the master IC and slave IC respectively of FIG. 5, according to an example embodiment of the present invention.
Figure 6B:
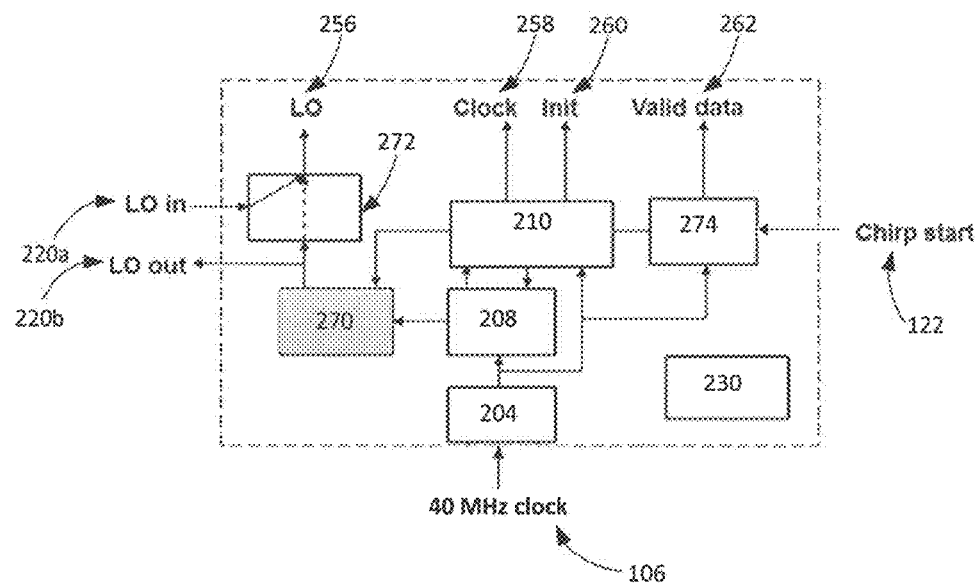

FIGS. 6A and 6B illustrate the internal architecture of the clock circuitry of the master IC 14 and slave ICs 16 respectively, which include the following elements:

The oscillator circuitry 104 on the master IC 14 is attached to a crystal resonator 102. It creates the fundamental time base for the complete distributed system, outputting a (typical) 40 MHz signal 106 that is distributed to the slave ICs 16 via a PCB connection 124. At the slave ICs 16, the 40 MHz clock signal 106 is input to the oscillator circuitry 204 by the corresponding port as the crystal resonator 102 in the master IC 14. In this way, the oscillator circuitry 204 within the slave ICs 16 operates as a buffer to the external reference clock signal 106. Note that the reference clock signal 106 arriving at each slave IC 16 will be delayed by a certain amount of time, depending (among other factors) on the PCB distance between the master IC 14 and the respective slave IC 16.

The PLL clock generator 108, 110 uses the 40 MHz reference clock signal 106 as a reference for creating the high frequency ADC clock signal 158 for the ADC 150 in the receiver. The ADC clock signal 158 from the PLL clock generator 108, 110 may also be used as a dock input signal for chirp generator 170. In the case of a slave IC 16, the 40 MHz reference clock 106 comes from the master IC 14 by means of a PCB connection 124, as mentioned above. In this situation, the phase of the ADC clock signal 258 will also suffer from a phase difference, with respect to the corresponding ADC clock signal 158 generated at the master IC 14, that is proportional to the PCB distance (also referred to as "PCB skew") distance between the master IC 14 and the respective slave IC 16.

The chirp generation circuit 170 creates the LO signal 156 to be used at the master IC 14 and at the slave ICs 16. At the master IC 14, the LO signal is output as the 'LO out' signal 120b for distribution to the respective 'LO in' inputs 120a, 220a of the master and slave ICs 14, 16. At the master IC 14, a multiplexer (MUX) 172 transfers the LO signal 156 from the 'LO in' input 120a towards the mixer 146. A corresponding MUX 272 is provided in the slave IC 16. The MUX 172 is a support function that allows the Master IC 14 to transfer the LO signal 156 internally to the RX and TX section, if desired. In the configuration shown in FIGS. 6A and 6B, the MUX 172, 272 is connecting 'LO in' to the internal LO node 156, 256 for all ICs 14, 16. In the slave IC 16, the corresponding chirp generation circuit 270 is disabled and the 'LO out' port 220b is not used.

In addition, the master and slave ICs 14, 16 each include a timing engine 174, 274, which outputs a respective 'Valid data' signal 162, 262 to the corresponding decimation stage 52 and serial interface 54 (FIG. 4) of the corresponding RX channel. The timing engine 174 of the master IC 14 also outputs a 'chirp start' signal 122 for triggering the starting point of the timing engines 174, 274 within each IC 14, 16, which is transmitted between the master IC 14 and the slave IC 16. Each master IC 14 and slave IC 16 includes an SPI bus 130, 230 for communication with the MCU 12.

Figure 7:
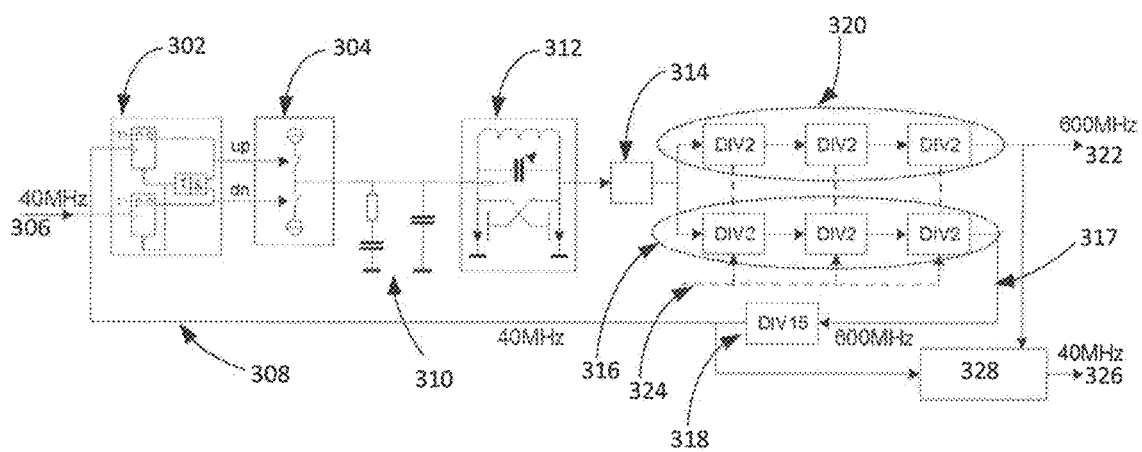
FIG. 7 illustrates a phase-locked loop (PLL) clock generator for the master and slave ICs of FIGS. 6A and 6B, according to an example embodiment of the present invention.

FIG. 7 illustrates the PLL clock generator 108, 110, 208, 210 included in each of the master and slave ICs 14, 16. A phase detector 302, 304, in the form of a dual-D flip-flop phase-frequency detector 302 and charge pump 304, is arranged to receive the reference clock signal 306 and a feedback clock signal 308. In the case of the master IC 14, the reference clock signal 306 is the reference clock signal 106 output by the crystal oscillator 104, 106. In the case of the slave IC 16, the reference clock signal 306 is clock signal 206 output by the oscillator circuitry 206 which receives and buffers the reference clock signal 106 received from the master IC 14 via the PCB connection 124. In this embodiment, the reference clock signal 306 is a 40 MHz clock signal. The output of the phase detector 302, 304 is filtered by a low pass filter 310 to provide a frequency control signal based on a phase difference between the reference clock signal 306 and the feedback clock signal 308. A variable-frequency oscillator, in the form of a VCO (voltage controlled oscillator) 312 controlled by the frequency control signal, outputs an oscillator signal having a frequency dependent on the frequency control signal. The oscillator signal is level shifted by a level shifter (LS) 314. In this embodiment, the oscillator signal has a frequency of 4.8 GHz.

The level-shifted oscillator signal is input into first divider circuitry 316, 318 for generating the feedback clock signal 308, in this case a 40 MHz feedback clock signal, by frequency dividing the oscillator signal. In this embodiment, the first divider circuitry 316, 318 is in the form of a feedback divider chain comprising a divide-by-8 cascaded divider 316, and a divide-by-15 cascaded divider 318. The level-shifted oscillator signal is also input into second divider circuitry 320 for generating an output clock signal 322, in this embodiment a 600 MHz output clock signal 322 for clocking the ADC 150, 250 of the respective IC 14, 16, by frequency dividing the oscillator signal. In this embodiment, the second divider circuitry 320 is in the form of a divider chain comprising a divide-by-8 cascaded divider 320. The 600 MHZ output clock signal 322 corresponds to the respective ADC clock signal 158, 258 (FIGS. 4, 5 and 6) in the master IC 14 and slave IC 14.

The divide-by-8 divider 316 of the first divider circuitry 316, 318 (i.e. the divide-by 8 divider in the feedback loop of the PLL) is synchronized to the divide-by-8 divider 320 of the second divider circuitry since each one receives the level-shifted oscillator signal generated by the VCO 312 as its clock input. Importantly, the exact phase relation between the divide-by-8 divider 316 of the first divider circuitry and the divide-by-8 divider 320 of the second divider circuitry is adjustable to delay the feedback clock signal 308 relative to the output clock signal 322, by means of control inputs 324. Equivalently, this has the effect of advancing the output clock signal 322 relative to the feedback clock signal 308.

The skilled person will appreciate that further divide or multiply stages may be included between the output of the VCO 312 and the first and second divider circuitry 316, 318, 320.

Figure 8:
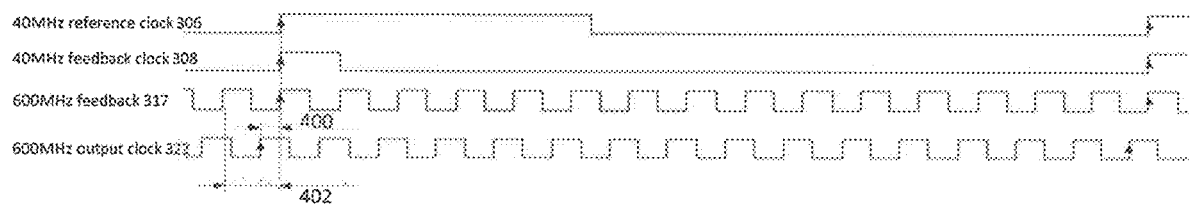
FIG. 8 illustrates the phase relationships between various signals generated by the circuitry of FIG. 7.

FIG. 8 illustrates the phase relationships between the 40 MHz reference clock signal 306, the 40 MHz feedback clock signal 308, the 600 MHz signal 317 output by the divide-by-8 divider 316 of the first divider circuitry, and the 600 MHz output clock signal 322 output by the second divider circuitry 320. FIG. 8 shows that the 600 MHz output clock signal 322 is in advance of the 40 MHz reference clock signal 306 by an adjustable 'skew' amount 400. The range 402 of possible 'skew' amounts is from 0 to $^{15}/_{16}$ T.

The phase of the 600 MHz signal 317 output by the divide-by-8 divider 316 of the first divider circuitry (in the feedback loop) can be delayed (relative to the 600 MHz output clock signal 322 output by the divide-by-8 divider 320 of the second divider circuitry) from 0 to $^{15}/_{16}$ of the time period T, where T=1/(600 MHz), in steps of $(^{1}/_{16})$T, which corresponds to approximately 104 ps.

Since the divide-by-8 divider 316 is part of the feedback loop of the PLL, the phase relation between the 600 MHz signal 317 output by the divide-by-8 divider 316 and the 40 MHz feedback clock signal 308 is automatically fixed, that is, their rising edges will always coincide. When, as described above, the 600 MHz signal 317 output by the divide-by-8 divider 316 in the feedback path is delayed for a part of its period, the 600 MHz output clock signal 322 for the ADC 150, 250 becomes advanced with respect to the 40 MHz reference clock signal 306, as shown in FIG. 8.

Using this arrangement for the PLL clock generator 108, 110, in the slave IC 16, the rising edge of the 600 MHZ output clock signal 322 in the slave IC can only be advanced with respect to the incoming 40 MHz reference clock signal 306. When, at the slave IC 16, a delay of the 600 MHz output clock signal 322 would be desired, the timing of the output clock signal 322 in the master IC 14 can be advanced instead.

The configuration shown in FIG. 7 does not allow the 600 MHz output clock signal 322 to be advanced by more than a single period with respect to the incoming 40 MHz reference clock signal 306. However, the delay between the respective reference clock signals 306 of the master and slave ICs 14, 16 may be greater than one period of the 600 MHz output clock signal 322. To accommodate greater delays, it is possible to manipulate a 40 MHz ADC reference clock signal 326, which goes to the respective ADC 150, 250 as a reference for the sampling time points of the ADC. This 40 MHz ADC reference clock signal 326 corresponds to the 'Init' signal 160 indicated in FIGS. 4 and 6. The 40 MHz ADC reference clock signal 326 is output by an ADC reference clock re-clocking unit 328, which re-clocks the 40 MHz feedback clock signal 308 based on the 600 MHz output clock, i.e. it shifts the 40 MHz ADC reference clock signal 326 over a number of periods of the 600 MHz output clock signal 322. This enables compensation of any amount of delay, provided it is less than the period of the 40 MHz ADC reference clock signal 326.

Figure 9A:
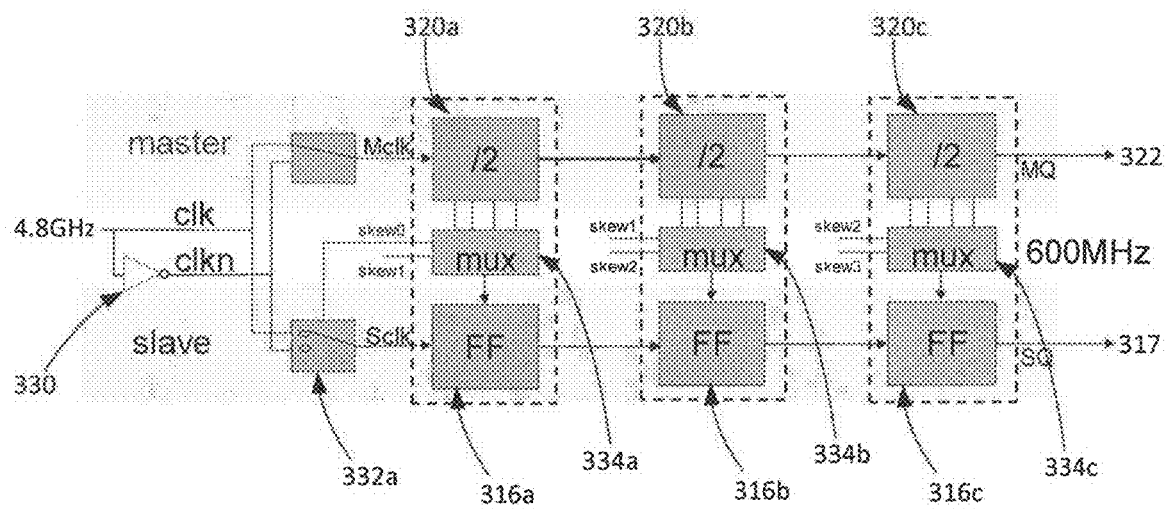
FIGS. 9A and 9B illustrate embodiments of a divider chain for the PLL clock generator of FIG. 7.
Figure 9B:
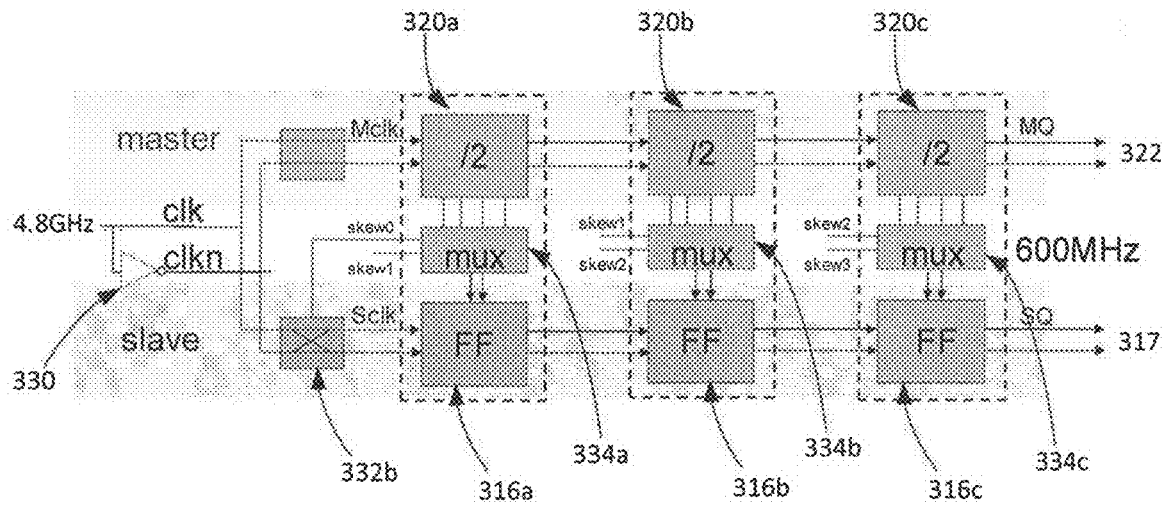

FIGS. 9A and 9B show two embodiments of the two divide-by-8 divider chains 316, 320, shown in FIG. 7. To obtain the skewing function (i.e. the time delay/advance between the two divide-by-8 dividers 316, 320), the divide-by-8 divider 320 of the second divider circuitry operates as a master divider, while the divide-by-8 divider 316 of the first divider circuitry (in the feedback loop) operates as a slave divider. This enables control of the phase relation between the outputs of the master divider 320 and slave divider 316. The master divider 320 generates the output clock signal 322 for the ADC 150, 250, while the slave divider 316 is part of the feedback loop.

In both embodiments (FIGS. 9A and 9B), the divide-by-8 divider 320 of the second divider circuitry 320 is built from three gated divide-by-two master dividers 320a, 320b, 320c. Similarly, the divide-by-8 divider 316 of the first divider circuitry 316, 318 is built from three gated divide-by-two slave dividers 316a, 316b, 316c. The first divide-by-two master divider 320a, of the second divider circuitry 322 operates as a master to the first divide-by-two slave divider 316a of the first divider circuitry 316, 318 to form a first master-slave pair 320a, 320b, and so on, giving a second master-slave pair 320b, 316b and a third master-slave pair 320c, 316c of dividers.

The first master divider 320a receives the oscillator signal output by the level shifter 314 as its clock input ('Mclk'). An inverter 330 receives the oscillator signal and outputs an inverted oscillator signal. A switching device 332 is provided for selecting between the oscillator signal and the inverted oscillator signal. The first slave divider 316a is arranged to selectively receive the oscillator signal or the inverted oscillator signal output from the switching device 332 as its clock input ('Sclk'), dependent upon a control signal 'skew0' input to the switching device 332. By switching the clock input of the first divide-by-2 slave divider 316a between the normal and inverted phase of the oscillator signal, it is possible to obtain the finest skew step, i.e. ½ a period of the 4.8 GHz oscillator signal, or 104 ps. This corresponds to a shift of ¹⁄₁₆ of a period of the 600 MHz output clock signal 322.

In the complete divide-by-8 divider chain, three equal divide-by-2 stages are used, in which the master divide-by-2 divider 320a, 320b, 320c generates four phases, and the corresponding slave divider 316a, 316b, 316c re-clocks a selected one of these four phases, selected using a respective multiplexer 334a, 334b, 334c controlled by the control signals 'skew0', 'skew1', 'skew2', 'skew3' (collectively indicated as control signal 324 in FIG. 7). The complete divide-by-8 chain shown in FIG. 9 enables the phase of the 600 MHz clock signal 317 output by the divide-by-8 divider 316 (i.e. the slave) to be shifted in ¹⁄₁₆ period steps compared with the 600 MHz output clock signal 322 output by the divide-by-8 divider 320 (i.e. the master), between ¹⁄₁₆ T and ¹⁵⁄₁₆ T.

The master divide-by-two dividers 320a, 320b, 320c and the slave divide-by-two dividers 316a, 316b, 316c use the same circuit to guarantee equal delays. Each slave divide-by-2 divider 316a, 316b, 316c can be either regarded as a re-clocking circuit or as a gated divider. Functionally seen, it is re-clocking a selected output of the corresponding master divide-by-2 divider 320a, 320b, 320c with the slave clock 'Sclk', but circuit-wise it is exactly the same divider circuit in master as well as slave.

The embodiment shown in FIG. 9A is simpler than that shown in FIG. 9B in that it generates single-ended signals. In contrast, FIG. 9B uses and generates (semi) differential clk and clkn signals so that opposite clock phases are available without delay.

Figure 10:
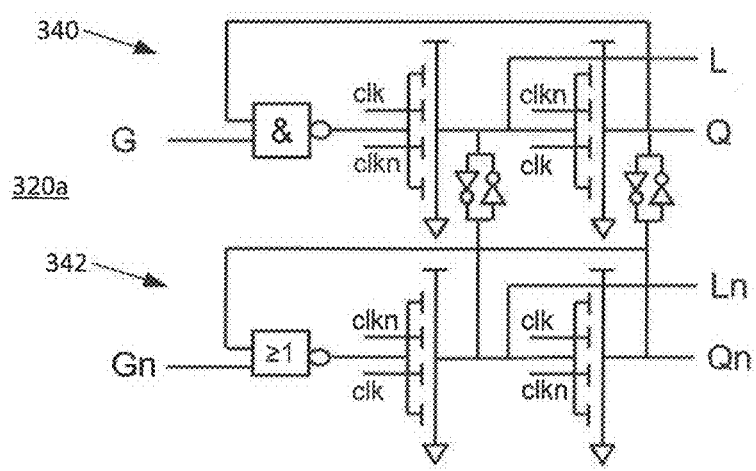
FIG. 10 illustrates a divide-by-2 divider for the divider chain of FIGS. 9A and 9B, according to an example embodiment of the present invention.

FIG. 10 illustrates an embodiment of the master divide-by-2 divider 320a in the form of a semi-differential flip-flop with four phase outputs L, Ln, Q, and Qn. The slave divide-by-2 divider 316a uses the same circuit. The divide-by-2 divider 320a comprises two single-ended flip-flops 340, 342. By using outputs of both latches of the first flip-flop 340, both phases L and Q are available from the first flip-flop. The second flip-flop 342 is used to generate the opposite phase output signals, Ln and Qn, with exactly the same delays from clock to output. The correct phase relation between the two flip-flops 340, 342 is obtained by gating. The divide-by-2 divider 320a also includes latches between the L and Ln outputs and between the Q and Qn outputs.

When used as the master divide-by-2 divider 320a, the gate-input G of the first flip-flop 340 is set to 1 and the gate-input Gn of the second flip-flop 342 is connected to the inverted Q output of the first flip-flop 340 in order to align both semi-differential flip-flop halves 340,342 in opposite phase. When used as the slave divide-by-2 divider 316a, both the G and Gn gate inputs of the divider 316a are connected to the required signals selected by the multiplexer 334a from the four phase outputs of the master divider 320a based on the control signals 'skew0', 'skew1', 'skew2', 'skew3' determining the skew setting.

Figure 11:
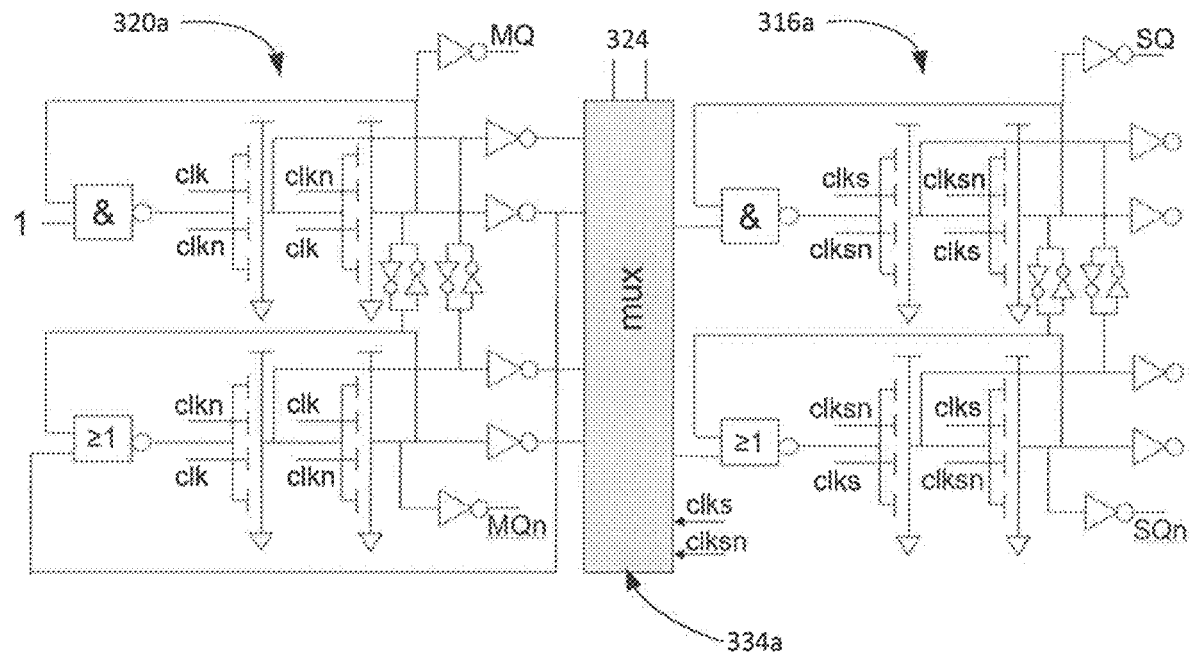
FIG. 11 illustrates a master-slave pair of divide-by-2 dividers for the divider chain of FIGS. 9A and 9B, according to an example embodiment of the present invention.
Figure 12:
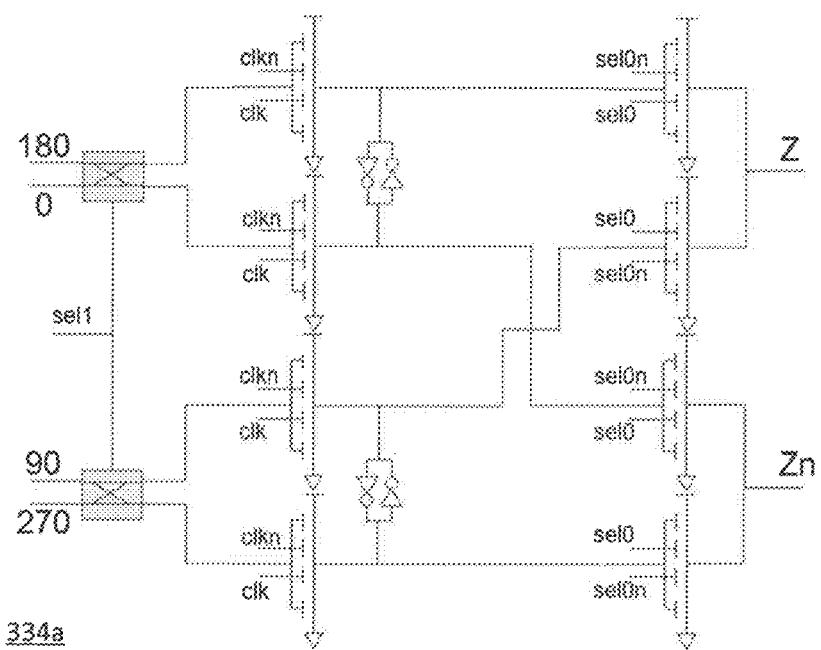
FIG. 12 illustrates a multiplexer for the master-slave pair of divide-by-2 dividers of FIG. 11, according to an example embodiment of the present invention.

FIG. 11 illustrates the master divide-by-2 divider 320a and the slave divide-by-2 divider 316a together with the respective multiplexer 334a. The second and third master-slave pairs 320b, 316b and 320c, 316b, use the same circuit. The respective multiplexer 334a, 334b, 334c selects the required gating signals for the respective slave divider 316a, 316b, 316c. FIG. 12 shows an embodiment of the multiplexer 334a, 334b, 334c using pipelining with an additional internal latch stage. This has a selection stage at the input, controlled by control signal 'sel', followed by a clocked latch stage and a further selection stage. This implementation is used to reach the high speed requirement.

As mentioned above, the amount of skew compensation provided by the PLL clock generator 108, 110, 208, 210 is controlled via the control inputs 324, shown as 'skew0' . . . 'skew3' in FIGS. 9A and 9B. The amount of skew compensation required is a function of the length of the PCB transmission lines 124 for transmitting the reference clock signal 106 between the master and slave ICs 14, 16. As the PCB layout is fixed for a given device, the skew compensation amount may be determined by an initial calibration. If the PCB delay is expected to change, for example due to second-order effects such as temperature changes, then a feed-forward compensation may be applied with a-priori stored coefficients on the central MCU 12. A number of temperature sensors may be provided for this purpose.

Although particular embodiments of the invention have been described above, it will be appreciated than many modifications, including additions and/or substitutions, may be made within the scope of the appended claims.

The invention claimed is:

1. An apparatus comprising a first integrated chip, the first integrated chip comprising:
   a first phase-locked loop comprising:
      a phase detector, arranged to receive a reference clock signal and a feedback clock signal and to output a frequency control signal based on a phase difference between the reference clock signal and the feedback clock signal;
      a variable-frequency oscillator arranged to output an oscillator signal having a frequency dependent on said frequency control signal;
      first divider circuitry for generating said feedback clock signal by frequency-dividing said oscillator signal; and
      second divider circuitry for generating an output clock signal by frequency-dividing said oscillator signal;
      wherein a phase relation between said first divider circuitry and said second divider circuitry is adjustable to delay or advance said output clock signal relative to said feedback clock signal by a multiple of one half of a period of said oscillator signal; and
   a first ADC arranged to receive said output clock signal.

2. The apparatus of claim 1, further comprising an inverter for inverting said oscillator signal to generate an inverted oscillator signal, wherein:
   one of said first divider circuitry and said second divider circuitry comprises a first master divider arranged to receive said oscillator signal;
   the other one of said first divider circuitry and said second divider circuitry comprises a first slave divider arranged to selectively receive said oscillator signal or said inverted oscillator signal; and
   said first slave divider is configured to re-clock a selected output of said first master divider based on said selected one of said oscillator signal and said inverted oscillator signal.

3. The apparatus of claim 2, wherein said first master divider and said first slave divider are each configured to divide by 2.

4. The apparatus of claim 2, wherein said first slave divider is configured to re-clock a selected one of four phase outputs of said first master divider.

5. The apparatus of claim 2, wherein said first slave divider comprises the same circuitry as said first master divider.

6. The apparatus of claim 2, wherein said first master divider comprises a differential flip-flop.

7. The apparatus of claim 2, wherein:
   said one of said first divider circuitry and said second divider circuitry comprises a second master divider arranged to receive an output of said first master divider;
   said other one of said first divider circuitry and said second divider circuitry comprises a second slave divider arranged to receive an output of said first slave divider; and
   said second slave divider is configured to re-clock a selected output of said second master divider based on said output of said first slave divider.

8. The apparatus of claim 7, wherein:
   said one of said first divider circuitry and said second divider circuitry comprises a third master divider arranged to receive an output of said second master divider;
   said other one of said first divider circuitry and said second divider circuitry comprises a third slave divider arranged to receive an output of said second slave divider; and
   said third slave divider is configured to re-clock a selected output of said third master divider based on said output of said second slave divider.

9. The apparatus of claim 1, wherein said second divider circuitry comprises at least one further divider.

10. The apparatus of claim 1, further comprising circuitry for re-clocking said feedback clock signal based on said output clock signal.

11. The apparatus of claim 1, wherein said reference clock signal is received via a printed circuit board.

12. The apparatus of claim 1, wherein said apparatus comprises:
   a second integrated chip, comprising:
      a second phase-locked loop configured to output a further output clock signal; and
      a further ADC arranged to receive said further output clock signal;
   wherein said first integrated chip is arranged to receive said reference clock signal from said second integrated chip.

13. The apparatus of claim 1, wherein said apparatus is a radar receiver or transceiver.

14. A radar receiver comprising:
   a first phase-locked loop comprising:
      a phase detector, arranged to receive a reference clock signal and a feedback clock signal and to output a frequency control signal based on a phase difference between the reference clock signal and the feedback clock signal;
      a variable-frequency oscillator arranged to output an oscillator signal having a frequency dependent on said frequency control signal;
      first divider circuitry for generating said feedback clock signal by frequency-dividing said oscillator signal; and
      second divider circuitry for generating an output clock signal by frequency-dividing said oscillator signal, a phase relation between said first divider circuitry and said second divider circuitry adjustable to delay or advance said output clock signal relative to said feedback clock signal by a multiple of one half of a period of said oscillator signal.

15. The radar receiver of claim 14, further comprising an inverter for inverting said oscillator signal to generate an inverted oscillator signal, wherein:
   one of said first divider circuitry and said second divider circuitry comprises a first master divider arranged to receive said oscillator signal;
   the other one of said first divider circuitry and said second divider circuitry comprises a first slave divider arranged to selectively receive said oscillator signal or said inverted oscillator signal; and
   said first slave divider is configured to re-clock a selected output of said first master divider based on said selected one of said oscillator signal and said inverted oscillator signal.

16. The radar receiver of claim 14, further comprising circuitry for re-clocking said feedback clock signal based on said output clock signal.

17. The radar receiver of claim 14, wherein said radar receiver comprises:

a first integrated chip comprising:
　　said first phase-locked loop; and
　　a first ADC arranged to receive said output clock signal.

18. The radar receiver of claim 14, wherein said first slave divider is configured to re-clock a selected one of four phase outputs of said first master divider.

19. An apparatus comprising:
a first phase-locked loop comprising:
　　a phase detector, arranged to receive a reference clock signal and a feedback clock signal and to output a frequency control signal based on a phase difference between the reference clock signal and the feedback clock signal;
　　a variable-frequency oscillator arranged to output an oscillator signal having a frequency dependent on said frequency control signal;
　　first divider circuitry for generating said feedback clock signal by frequency-dividing said oscillator signal;
　　second divider circuitry for generating an output clock signal by frequency-dividing said oscillator signal, a phase relation between said first divider circuitry and said second divider circuitry adjustable to delay or advance said output clock signal relative to said feedback clock signal; and
　　circuitry for re-clocking said feedback clock signal based on said output clock signal.

20. A radar transceiver comprising a first integrated chip, the first integrated chip comprising:
a first phase-locked loop comprising:
　　a phase detector, arranged to receive a reference clock signal and a feedback clock signal and to output a frequency control signal based on a phase difference between the reference clock signal and the feedback clock signal;
　　a variable-frequency oscillator arranged to output an oscillator signal having a frequency dependent on said frequency control signal;
　　first divider circuitry for generating said feedback clock signal by frequency-dividing said oscillator signal; and
　　second divider circuitry for generating an output clock signal by frequency-dividing said oscillator signal;
　　wherein a phase relation between said first divider circuitry and said second divider circuitry is adjustable to delay or advance said output clock signal relative to said feedback clock signal; and
a first ADC arranged to receive said output clock signal.

* * * * *